(12) United States Patent
Penny et al.

(10) Patent No.: US 10,361,117 B2
(45) Date of Patent: Jul. 23, 2019

(54) SELECTIVE ILD DEPOSITION FOR FULLY ALIGNED VIA WITH AIRGAP

(71) Applicant: INTERNATIONAL BUSINESS MACHINES CORPORATION, Armonk, NY (US)

(72) Inventors: Christopher J. Penny, Saratoga Springs, NY (US); Benjamin D. Briggs, Waterford, NY (US); Huai Huang, Saratoga, NY (US); Lawrence A. Clevenger, Rhinebeck, NY (US); Michael Rizzolo, Albany, NY (US); Hosadurga Shobha, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/837,361

(22) Filed: Dec. 11, 2017

(65) Prior Publication Data

US 2019/0181033 A1    Jun. 13, 2019

(51) Int. Cl.
*H01L 23/48* (2006.01)
*H01L 21/768* (2006.01)
*H01L 23/528* (2006.01)

(52) U.S. Cl.
CPC .... *H01L 21/7682* (2013.01); *H01L 21/76808* (2013.01); *H01L 21/76813* (2013.01); *H01L 21/76828* (2013.01); *H01L 21/76831* (2013.01); *H01L 21/76897* (2013.01); *H01L 23/5283* (2013.01)

(58) Field of Classification Search
CPC ........... H01L 21/7682; H01L 21/76808; H01L 21/76813; H01L 21/76828; H01L 21/76831; H01L 21/76897; H01L 23/5283
USPC ........................................................ 257/774
See application file for complete search history.

(56) References Cited

U.S. PATENT DOCUMENTS

| | | | |
|---|---|---|---|
| 6,091,149 A | 7/2000 | Hause et al. | |
| 6,281,585 B1 | 8/2001 | Bothra | |
| 6,492,732 B2 | 12/2002 | Lee et al. | |
| 8,900,988 B2 | 12/2014 | Lin et al. | |
| 9,324,650 B2 | 4/2016 | Edelstein et al. | |
| 9,368,395 B1 | 6/2016 | Wei et al. | |
| 9,449,871 B1 | 9/2016 | Bergendahl et al. | |
| 2003/0077893 A1* | 4/2003 | Demolliens | H01L 21/7682 438/622 |
| 2014/0363969 A1 | 12/2014 | Chen et al. | |
| 2015/0200160 A1 | 7/2015 | Su et al. | |

* cited by examiner

*Primary Examiner* — Tu-Tu V Ho
(74) *Attorney, Agent, or Firm* — Tutunjian & Bitetto, P.C.; Vazken Alexanian

(57) ABSTRACT

A method is presented forming a fully-aligned via (FAV) and airgaps within a semiconductor device. The method includes forming a plurality of copper (Cu) trenches within an insulating layer, forming a plurality of ILD regions over exposed portions of the insulating layer, selectively removing a first section of the ILD regions in an airgap region, and maintaining a second section of the ILD regions in a non-airgap region. The method further includes forming airgaps in the airgap region and forming a via in the non-airgap region contacting a Cu trench of the plurality of Cu trenches.

13 Claims, 12 Drawing Sheets

SELECTIVE ILD DEPOSITION FOR FULLY ALIGNED VIA WITH AIRGAP

BACKGROUND

Technical Field

The present invention relates generally to semiconductor devices, and more specifically, to an integrated airgap and selective-dielectric fully-aligned via (FAV) at a same metallization level without employing an additional airgap mask.

Description of the Related Art

As process dimensions continue to shrink, litho-etch patterning for semiconductor devices is usually needed to print 64 nanometer (nm) pitch metal layers (Mx levels) or below. However, poor overlay can be a significant factor for consideration in successful patterning applications. For example, without self-aligned via (SAV) processes, the dielectric space between copper lines and vias can become small, which can cause reliability issues. Furthermore, current SAV processes are usually self-aligned only in one direction. A weak point for the reliability failure mechanism of time dependent dielectric breakdown (herein "TDDB") can form due to the proximity of the via bottom to an unrelated metal beneath it. A breakdown can occur along this interface leading to increased leakage or a dead short, thus compromising product functionality.

SUMMARY

In accordance with an embodiment, a method is provided for forming a fully-aligned via (FAV) and airgaps within a semiconductor device. The method includes forming a plurality of trenches within an insulating layer formed over a semiconductor substrate, the plurality of trenches filled with a conductive material, selectively forming inter-layer dielectric (ILD) regions over exposed top surfaces of the insulating layer, forming a hardmask, and selectively removing a portion of the ILD regions where the airgaps are subsequently formed. The method further includes removing the hardmask, causing minimal ILD damage at least to exposed sections of the insulating layer located on sidewalls of the plurality of trenches, removing the ILD damaged sections of the insulating layer to form recesses defining airgap regions, depositing a conformal cap within the recesses, and depositing a dielectric layer such that the airgaps are formed in the airgap regions between the plurality of trenches.

In accordance with an embodiment, a method is provided for forming a fully-aligned via (FAV) and airgaps within a semiconductor device. The method includes forming a plurality of copper (Cu) trenches within an insulating layer, forming a plurality of ILD regions over exposed portions of the insulating layer, selectively removing a first section of the ILD regions in airgap regions, and maintaining a second section of the ILD regions in a non-airgap region. The method further includes forming airgaps in the airgap regions and forming a via in the non-airgap region contacting a Cu trench of the plurality of Cu trenches, the via filled with Cu.

In accordance with another embodiment, a semiconductor device is provided for integrating a fully-aligned via (FAV) with airgaps. The semiconductor device includes an airgap region including a plurality of airgaps formed between a plurality of first trenches, the airgap region devoid of inter-layer dielectric (ILD) regions and a non-airgap region including the FAV contacting a trench of a plurality of second trenches and the FAV contacting one or more ILD regions.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
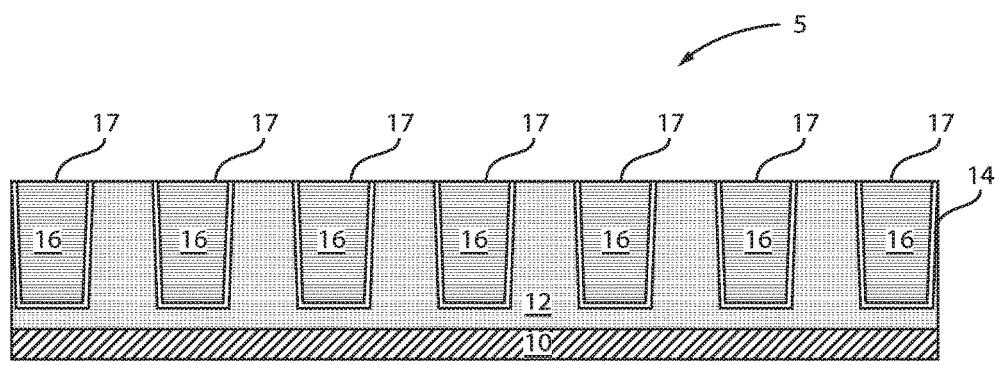
FIG. 1 is a cross-sectional view of a semiconductor structure including a plurality of copper (Cu) regions formed within an insulating layer, in accordance with an embodiment of the present invention.

Embodiments in accordance with the present invention provide methods and devices for constructing fully-aligned vias (FAVs) for low capacitance wiring in semiconductor devices. The FAVs are integrated with airgap structures at a same metallization level. With the 7 nm technology node in the development phase and the 5 nm node moving into development, transistor scaling gets ever more complex. On top of that, performance benefits gained at the front-end-of-line (i.e., the transistors) can easily be undone if the back-end-of-line (BEOL) can't come along. BEOL processing involves the creation of stacked layers of copper (Cu) wires that electrically interconnect transistors in a chip. With each technology node, this Cu wiring scheme becomes more complex, mainly because there are more transistors to connect with an ever tighter pitch. Shrinking dimensions also means the wires have a reduced cross-sectional area, which drives up the resistance-capacitance product (RC) of the interconnect system.

Cu-based dual damascene has been the workhorse process flow for interconnects. A simple dual damascene flow starts with deposition of a low-k dielectric material on a structure. These low-k films are designed to reduce the capacitance and the delay in the integrated circuits (ICs). In a next step, this dielectric layer is covered with an oxide and a resist, and vias and trenches are formed using lithography and etch steps. These vias connect one metal layer with the layer above or below. Then, a metallic barrier layer is added to prevent Cu atoms from migrating into the low-k materials. The barrier layers are deposited with, e.g., physical vapor deposition (PVD), using materials such as tantalum and tantalum nitride. In a final step, this structure is electroplated by Cu in a chemical mechanical polishing (CMP) step.

Embodiments in accordance with the present invention provide methods and devices for integrating airgap structures and selective-dielectric fully-aligned vias (FAV) at a same metallization level without using additional airgap masks during the fabrication process. The selective dielectrics can be employed as a mask for airgap formation. Moreover, self-aligned contacts and via patterning are employed for patterning multiple contacts or vias from a single lithographic feature. Self-aligned contact and via patterning makes use of the intersection of an enlarged feature resist mask and underlying trenches which are surrounded by a pre-patterned hardmask layer. This technique can be used in, e.g., dynamic random access memory (DRAM) cells and can also be used for advanced logic to avoid multiple exposures of pitch-splitting contacts and vias. In accordance with embodiments of the present invention, the formation of low capacitance selective dielectrics does not contribute to rise of Cu resistivity.

Examples of semiconductor materials that can be employed in forming such structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

FIG. 1 is a cross-sectional view of a semiconductor structure including a plurality of copper (Cu) regions formed within an insulating layer, in accordance with an embodiment of the present invention.

A semiconductor structure 5 includes a semiconductor substrate 10. An insulator layer 12 is deposited over the substrate 10. The insulating layer 12 is etched to form trenches thereon. A conductive fill material or liner 14 is formed or deposited around each of the trenches. In one example, the liner can be a tantalum nitride (TaN) liner 14 or in the alternative a tantalum (Ta) liner 14. In one example embodiment, the conductive fill material 14 can be deposited, for example, by electroplating, electroless plating, chemical vapor deposition (CVD), atomic layer deposition (ALD) and/or physical vapor deposition (PVD).

The trenches are then configured to receive a conductive material 16. The conductive material 16 can be a metal, such as copper (Cu) 16. One skilled in the art may contemplate a plurality of Cu regions 16 defined within the insulator layer 12. A top surface 17 of the Cu regions 16 can be exposed. In another embodiment, the conductive material 16 can be, for example, a metal or doped polysilicon (poly-Si). Non-limiting examples of metals include aluminum (Al), platinum (Pt), gold (Au), tungsten (W), titanium (Ti), or any combination thereof. The metal can be deposited by a suitable deposition process, for example, chemical vapor deposition (CVD), plasma enhanced chemical vapor deposition (PECVD), physical vapor deposition (PVD), plating, thermal or e-beam evaporation, or sputtering.

As used throughout the instant application, the term "copper" is intended to include substantially pure elemental copper, copper including unavoidable impurities including a native oxide, and copper alloys including one or more additional elements such as carbon, nitrogen, magnesium, aluminum, titanium, vanadium, chromium, manganese, nickel, zinc, germanium, strontium, zirconium, silver, indium, tin, tantalum, and platinum. In embodiments, the copper alloy is a copper-manganese alloy. In further embodiments, in lieu of copper, cobalt metal (Co) or cobalt metal alloys can be employed. The copper-containing structures are electrically conductive. "Electrically conductive" as used through the present disclosure refers to a material having a room temperature conductivity of at least $10^{-8}$ $(\Omega\text{-m})^{-1}$.

Figure 2:
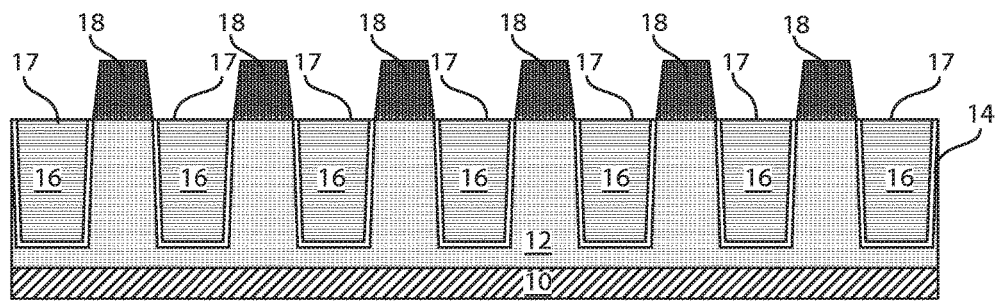
FIG. 2 is a cross-sectional view of the semiconductor structure of FIG. 1 where inter-layer dielectric (ILD) regions are formed over exposed top surfaces of the insulating layer, in accordance with an embodiment of the present invention.

FIG. 2 is a cross-sectional view of the semiconductor structure of FIG. 1 where inter-layer dielectric (ILD) regions are formed over exposed top surfaces of the insulating layer, in accordance with an embodiment of the present invention.

In various exemplary embodiments, ILD regions 18 can be formed over the exposed top portions or sections of the insulating layer 12. Suitable dielectric materials for forming the ILD regions 18 include but are not limited to, silicon oxide, silicon nitride, silicon oxynitride, SiCO, SiCON, or any suitable combination of such materials.

Figure 3:
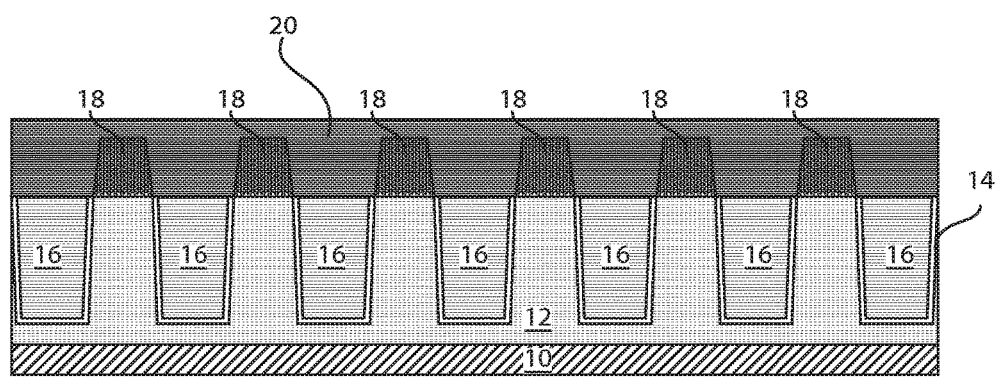
FIG. 3 is a cross-sectional view of the semiconductor structure of FIG. 2 where a dielectric is deposited over the ILD regions and over the Cu regions, in accordance with an embodiment of the present invention.

FIG. 3 is a cross-sectional view of the semiconductor structure of FIG. 2 where a dielectric is deposited over the ILD regions and over the Cu regions, in accordance with an embodiment of the present invention.

In various exemplary embodiments, a dielectric 20 is deposited over the ILD regions 18. The dielectric 20 can include an oxide, nitride or oxynitride material layer. In one example, when the dielectric 20 includes an oxide, the dielectric 20 can include silicon oxide (SiO$_2$). In some embodiments, the dielectric 20 can include a low-k dielectric material. The deposition process for forming the dielectric 20 can include chemical vapor deposition (CVD), plasma enhanced chemical vapor deposition (PECVD), physical vapor deposition (PVD), high-density plasma CVD or spin-on glass process. In one example embodiment, the dielectric 20 can have a thickness of about 10 nanometers (nm) to about 1000 nm, or about 100 nm to about 500 nm.

Figure 4:
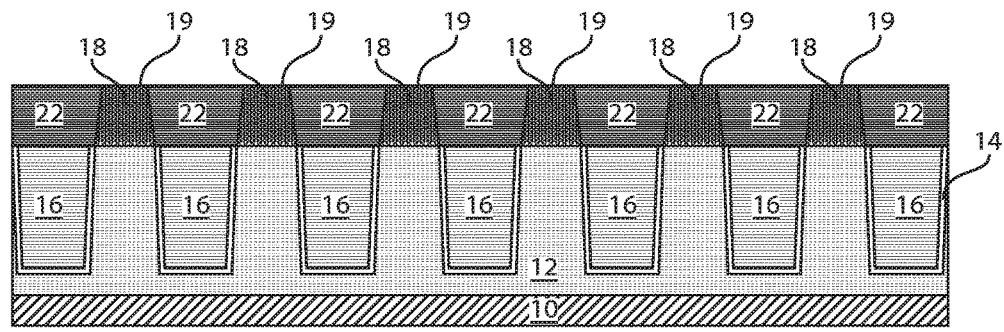
FIG. 4 is a cross-sectional view of the semiconductor structure of FIG. 3 where the dielectric is planarized such that the top surface of the dielectric is flush with the top surface of the ILD regions, in accordance with an embodiment of the present invention.

FIG. 4 is a cross-sectional view of the semiconductor structure of FIG. 3 where the dielectric is planarized such that the top surface of the dielectric is flush with the top surface of the ILD regions, in accordance with an embodiment of the present invention.

In various exemplary embodiments, a height of the dielectric 20 can be reduced by chemical-mechanical polishing (CMP) and/or etching. Therefore, the planarization process can be provided by CMP. Other planarization process can include grinding and polishing. The planarization of dielectric 20 results in dielectric regions 22 formed between the ILD regions 18 having a top surface 19.

Figure 5:
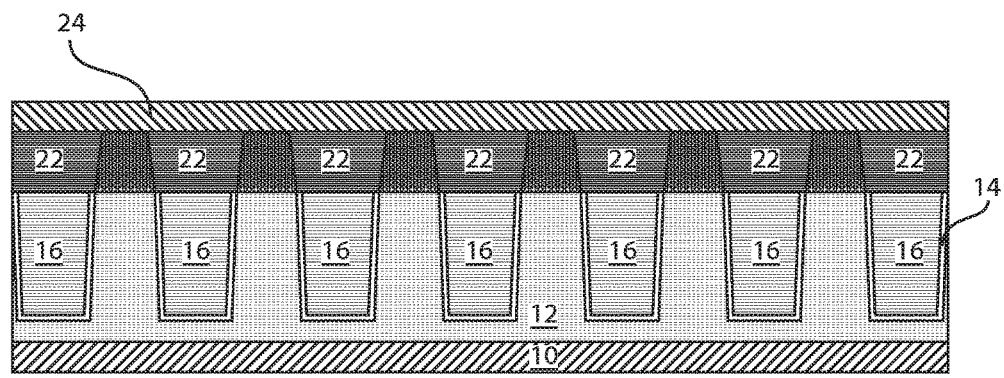
FIG. 5 is a cross-sectional view of the semiconductor structure of FIG. 4 where a hardmask is formed over the dielectric and ILD regions, in accordance with an embodiment of the present invention.

FIG. 5 is a cross-sectional view of the semiconductor structure of FIG. 4 where a hardmask is formed over the dielectric and ILD regions, in accordance with an embodiment of the present invention.

In various exemplary embodiments, a hardmask 24 is deposited. The hardmask 24 can be manufactured of silicon nitride (SiN), deposited using, for example, low pressure chemical vapor deposition (LPCVD). In other embodiments, the hardmask 24 can include, but is not limited to, hafnium oxide ($HfO_2$) or tantalum nitride (TaN). The hardmask 24 disposed over the Cu regions 16 and the ILD regions 18 is a layer of sufficient thickness to protect the Cu regions 16 and the ILD regions 18 from damage during the removal of subsequent layers.

Figure 6:
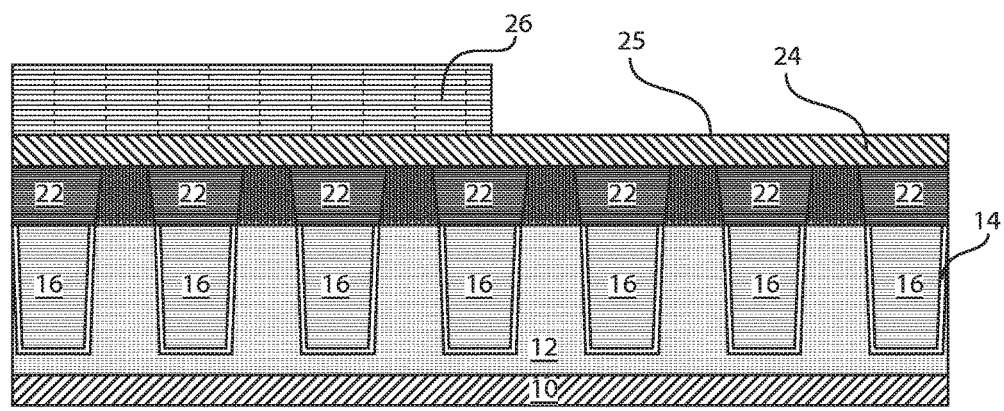
FIG. 6 is a cross-sectional view of the semiconductor structure of FIG. 5 where a sacrificial layer is deposited over a portion of the hardmask, in accordance with an embodiment of the present invention.

FIG. 6 is a cross-sectional view of the semiconductor structure of FIG. 5 where a sacrificial layer is deposited over a portion of the hardmask, in accordance with an embodiment of the present invention.

In various exemplary embodiments, a sacrificial layer 26 is deposited over a portion of the hardmask 24. A top surface 25 of the hardmask 24 is thus exposed. The sacrificial layer 26 can be, for example, amorphous carbon (a-C). The sacrificial layer 26 can be deposited by a suitable deposition process, for example, chemical vapor deposition (CVD), or other suitable process.

Figure 7:
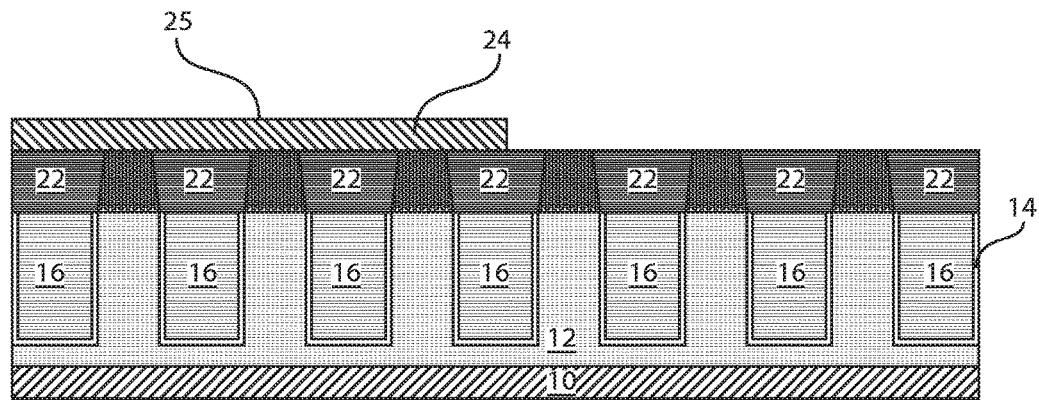
FIG. 7 is a cross-sectional view of the semiconductor structure of FIG. 6 where the exposed hardmask is etched and the sacrificial layer is removed to expose a portion of the ILD regions, in accordance with an embodiment of the present invention.

FIG. 7 is a cross-sectional view of the semiconductor structure of FIG. 6 where the exposed hardmask is etched and the sacrificial layer is removed to expose a portion of the ILD regions, in accordance with an embodiment of the present invention.

In various exemplary embodiments, the exposed hardmask 24 is etched and the sacrificial layer 26 is completely removed. A section or portion of the hardmask 24 remains intact to cover a portion of the dielectric regions 22 and a portion of the ILD regions 18. The etching can include a dry etching process such as, for example, reactive ion etching, plasma etching, ion etching or laser ablation. The etching can further include a wet chemical etching process in which one or more chemical etchants are employed to remove portions of the layers.

Figure 8:
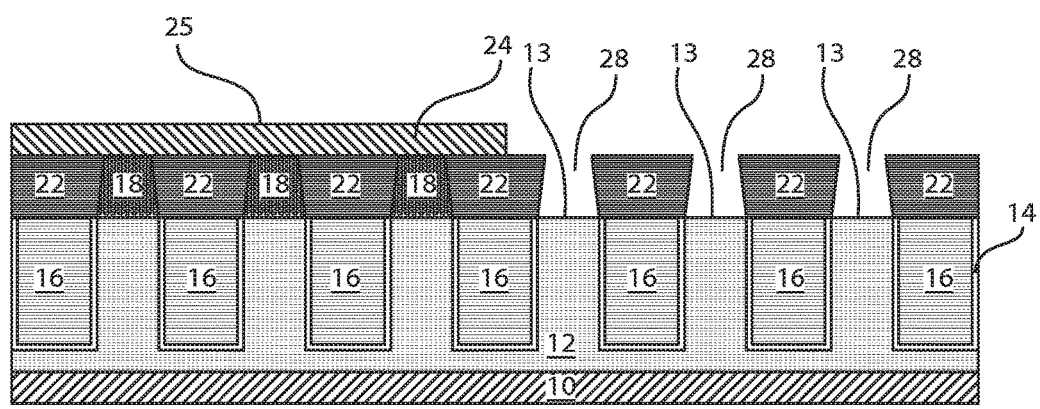
FIG. 8 is a cross-sectional view of the semiconductor structure of FIG. 7 where the exposed ILD regions are selectively removed to expose a top surface of the insulating layer, in accordance with an embodiment of the present invention.

FIG. 8 is a cross-sectional view of the semiconductor structure of FIG. 7 where the exposed ILD regions are selectively removed to expose a top surface of the insulating layer, in accordance with an embodiment of the present invention.

In various exemplary embodiments, the exposed ILD regions 18 are selectively removed resulting in the formation of recesses or gaps 28. The regions where the recesses or gaps 28 are formed can be referred to as an airgap region defining a plurality of airgaps. The region or area maintaining the ILD regions 18 can be referred to as a non-airgap region or a FAV region.

Figure 13:
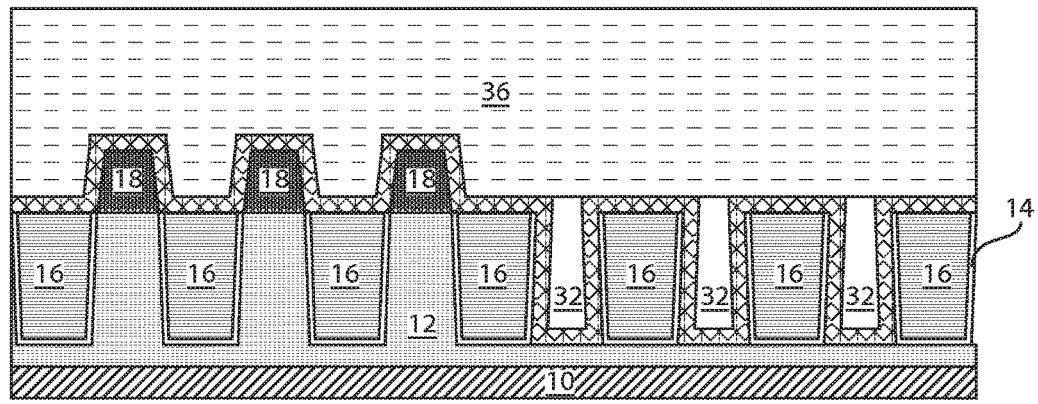
FIG. 13 is a cross-sectional view of the semiconductor structure of FIG. 12 where an ILD layer is deposited over the structure such that airgaps are formed at the exposed portions of the insulating layer, in accordance with an embodiment of the present invention.

Additionally, top surfaces 13 of the insulating layer 12 are exposed. The exposed ILD regions 18 can be removed by, e.g., dilute hydrofluoric acid (DHF). The remaining ILD regions 18 (under the hardmask 24) are employed as a mask for airgap formation in the airgap region of the device. Stated differently, the removal of selective ILD regions 18 occurs in the airgap region subsequently defining a plurality of airgaps (FIG. 13).

Figure 9:
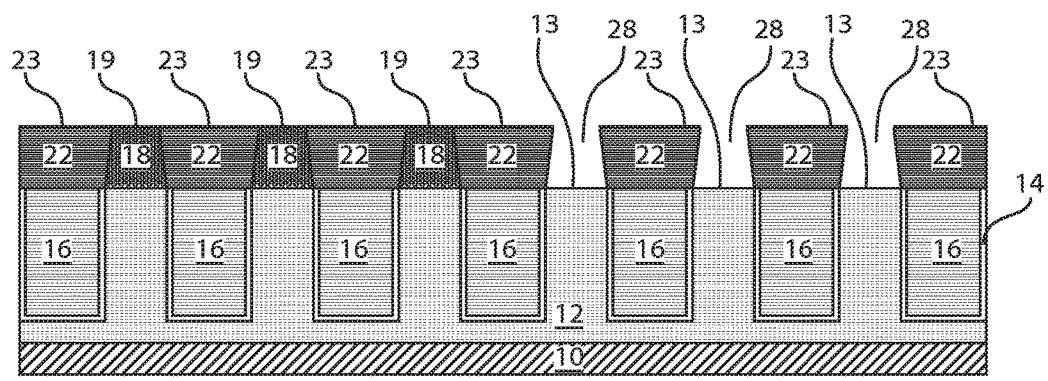
FIG. 9 is a cross-sectional view of the semiconductor structure of FIG. 8 where the hardmask is removed to expose the remaining ILD regions, in accordance with an embodiment of the present invention.

FIG. 9 is a cross-sectional view of the semiconductor structure of FIG. 8 where the hardmask is removed to expose the remaining ILD regions, in accordance with an embodiment of the present invention.

In various exemplary embodiments, the remaining hardmask 24 is removed in the FAV region to expose the top surface 19 of the ILD regions 18 and the top surface 23 of the dielectric regions 22. The remaining hardmask 24 can be removed by employing a dry etching process, for example, and anisotropic etching process.

Figure 10:
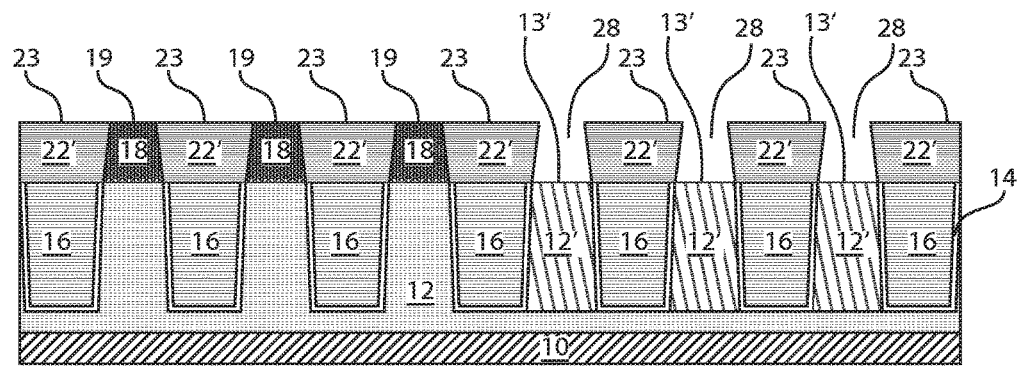
FIG. 10 is a cross-sectional view of the semiconductor structure of FIG. 9 where minimal ILD damage is caused to the dielectric and the exposed portions of the insulating layer, in accordance with an embodiment of the present invention.

FIG. 10 is a cross-sectional view of the semiconductor structure of FIG. 9 where minimal ILD damage is caused to the dielectric and the exposed portions of the insulating layer, in accordance with an embodiment of the present invention.

In various exemplary embodiments, minimal ILD damage is caused to form dielectric regions 22' between the ILD regions 18 and to form insulating layer areas 12' with top surfaces 13'. An ash process can be employed to cause the minimal ILD damage. As a consequence of such a chemically and physically "friendly" ash process, the original chemical and physical integrity of the remaining materials is maintained. The minimal ILD damage is caused in both the airgaps region and the non-airgap region or FAV region. The minimal ILD damage aids in the subsequent formation of airgaps in the airgap region.

Figure 11:
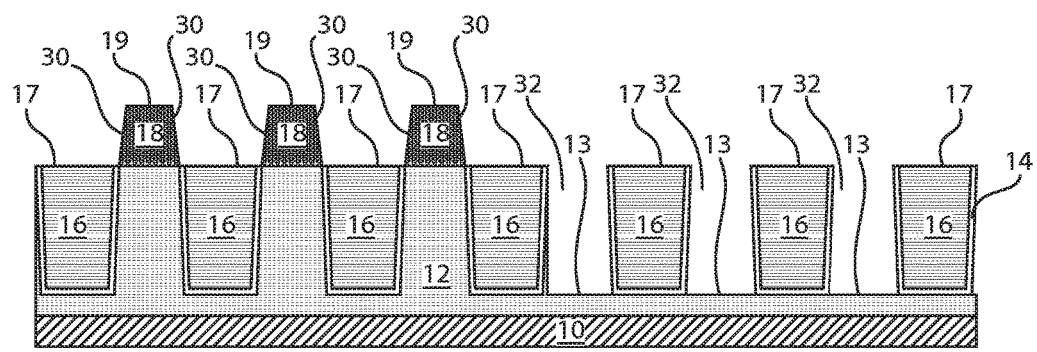
FIG. 11 is a cross-sectional view of the semiconductor structure of FIG. 10 where the minimally damaged dielectric and exposed portions of the insulating layer are selectively removed, in accordance with an embodiment of the present invention.

FIG. 11 is a cross-sectional view of the semiconductor structure of FIG. 10 where the minimally damaged dielectric and exposed portions of the insulating layer are selectively removed, in accordance with an embodiment of the present invention.

In various exemplary embodiments, the ILD damaged dielectric regions 22' and the ILD damaged insulating layer areas 12' are selectively removed to fully expose the remaining ILD regions 18 having top surfaces 19 and sidewalls 30. Moreover, recesses 32 are formed resulting from the removal of the ILD damaged insulating layer areas 12'. The recesses 32 are formed in the airgap region of the device. This also results in the exposure of top surfaces 13 of the insulating layer 12, as well as the exposure of side surfaces of the conductive fill material or liner 14.

Figure 12:
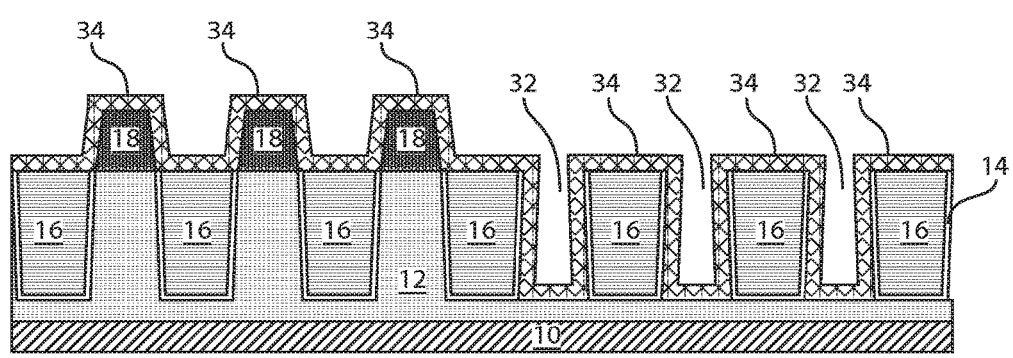
FIG. 12 is a cross-sectional view of the semiconductor structure of FIG. 11 where a conformal cap is deposited, in accordance with an embodiment of the present invention.

FIG. 12 is a cross-sectional view of the semiconductor structure of FIG. 11 where a conformal cap is deposited, in accordance with an embodiment of the present invention.

In various exemplary embodiments, the conformal dielectric cap 34 includes any non-oxygen having a dielectric capping material such as, for example, SiC, $Si_3N_4$, a carbon doped oxide, a nitrogen and hydrogen doped silicon carbide SiC(N,H), boron nitride, SiCBN, carbon boron nitride or multilayers thereof. The recesses 32 remain after formation of the conformal cap 34.

FIG. 13 is a cross-sectional view of the semiconductor structure of FIG. 12 where an ILD layer is deposited over the structure such that airgaps are formed at the exposed portions of the insulating layer, in accordance with an embodiment of the present invention.

In various exemplary embodiments, a dielectric layer 36 (e.g., an oxide layer) is then deposited over structure. The dielectric layer 36 can be an interlevel dielectric (ILD). In various embodiments, a height of the dielectric layer 36 can be reduced by chemical-mechanical polishing (CMP) and/or etching.

The deposition of the dielectric layer 36 causes the airgaps 32 to be maintained between the plurality of trenches 16. The dielectric layer 36 is a non-conformal PECVD process which has poor step coverage in recess 32 with narrow metal lines and tends to "pinch off," thus creating air gap structure in recess 32.

Therefore, airgaps and selective-dielectric fully-aligned via (FAV) can be integrated at the same metallization level without using an additional airgap mask. The ILD regions 18 serve as the selective dielectric for the FAV. The selective ILD regions 18 are thus employed as a mask for formation of the airgaps 32. Thus, a FAV with a selective dielectric guiding pattern can be created at the same metallization level with the airgaps 32 formed on a different part of the chip. The airgaps 32 formed in the airgap region of the device enable low capacitance wiring in semiconductor devices. The block mask 24 can be used so that only areas on the chip with minimum spaces and a need for low capacitance receives the airgaps. This maximizes the thermal conductance and mechanical stability of the chip.

Because of continuing decreases in size of circuit components in semiconductor chips, there are a number of interconnect wiring challenges facing the technical community over the next few technology generations. Among these challenges is the issue of undesirable capacitance in dielectric materials between circuit wiring. One avenue being pursued according to the exemplary embodiments of the present invention is to lower interconnect capacitance by developing airgaps integrated with selective-dielectric FAV at the same metallization level. Stated differently, the spin-on dielectric backfill with planarization and selective wet removal enable tone inversion to remove selective dielectric in an airgap region prior to etch back airgap (EBAG) schemes. Therefore, the low capacitance selective ILD regions 18 do not provide issues with porosity as Cu line widths decrease in semiconductor circuits and the low capacitance selective ILD regions 18 do not contribute to rise of Cu resistivity as Cu line widths decrease in semiconductor circuits.

Figure 14:
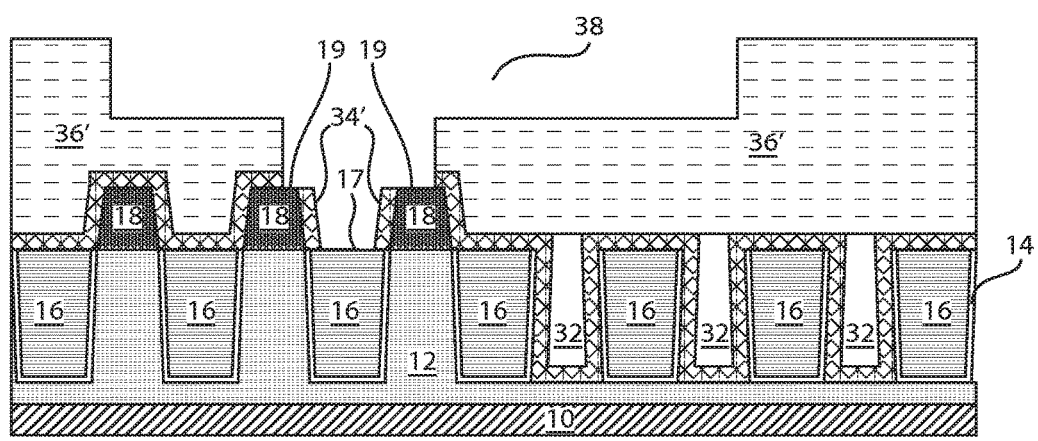
FIG. 14 is a cross-sectional view of the semiconductor structure of FIG. 13 where the ILD layer is etched to expose a top surface of at least one Cu region and top surfaces of ILD regions, in accordance with an embodiment of the present invention.

FIG. 14 is a cross-sectional view of the semiconductor structure of FIG. 13 where the ILD layer is etched to expose a top surface of at least one Cu region and top surfaces of ILD regions, in accordance with an embodiment of the present invention.

In various exemplary embodiments, the dielectric layer 36 is etched to form remaining dielectric layers 36'. A recess 38 is formed exposing a top surface 19 of the dielectric regions 18 and a top surface 17 of a Cu region 16. Additionally, conformal dielectric cap portions 34' remain adjacent sidewalls of the ILD regions 18. The recess 38 can be, e.g., a via. The via 38 can be referred to as a fully-aligned via (FAV). The FAV can be aligned with the ILD regions 18 in the non-airgap region or FAV region.

Figure 15:
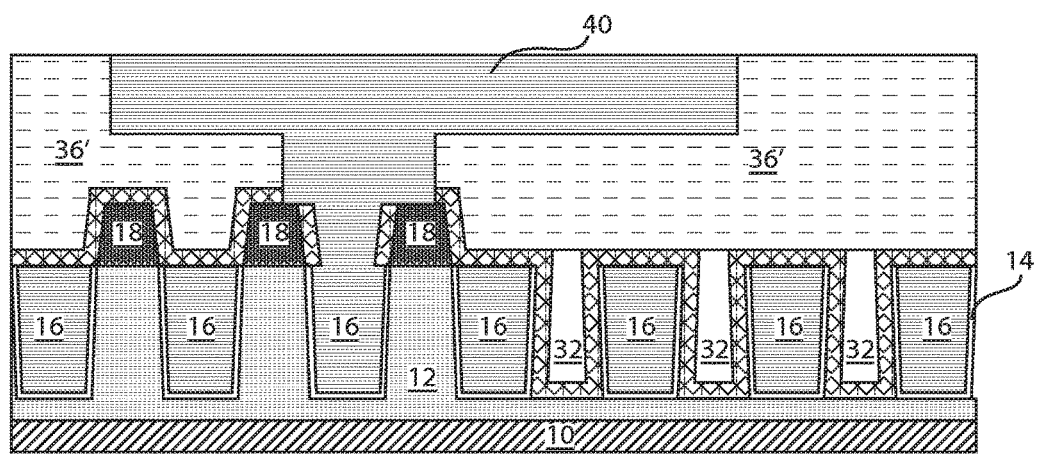
FIG. 15 is a cross-sectional view of the semiconductor structure of FIG. 14 where a metal fill takes place, in accordance with an embodiment of the present invention.

FIG. 15 is a cross-sectional view of the semiconductor structure of FIG. 14 where a metal fill takes place, in accordance with an embodiment of the present invention.

In various exemplary embodiments, a metal fill 40 takes place. The metal fill 40 can be, e.g., Cu or any other conductive material contemplated by one skilled in the art.

Regarding FIGS. 1-15 and FIGS. 16-35 described below, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Figure 16:
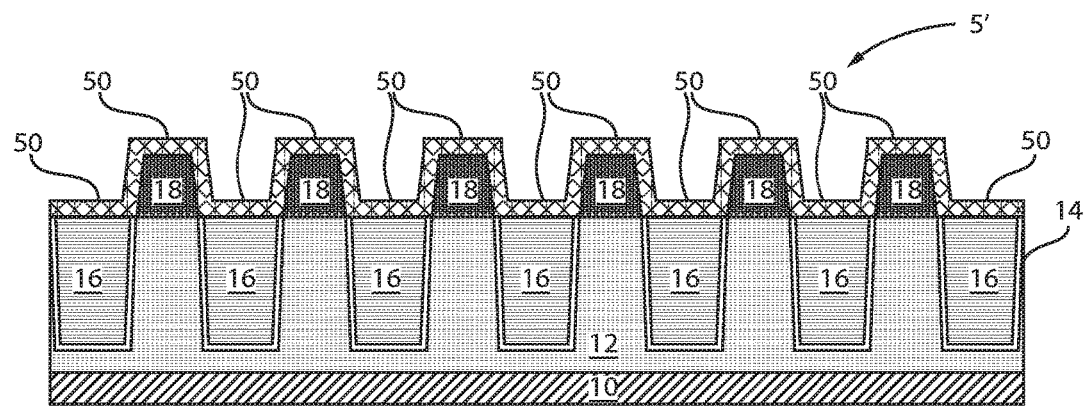
FIG. 16 is a cross-sectional view of the semiconductor structure of FIG. 2 where a dielectric cap is deposited over the ILD regions, in accordance with another embodiment of the present invention.

Patterning is the shaping or altering of deposited materials, and is generally referred to as lithography FIG. 16 is a cross-sectional view of the semiconductor structure of FIG. 2 where a dielectric cap is deposited over the ILD regions, in accordance with another embodiment of the present invention.

In various exemplary embodiments, a dielectric cap 50 is deposited over the ILD regions 18, as well as a top surface 17 of the Cu regions 16. In some embodiments, the dielectric cap 50 is formed of a single dielectric cap layer. In other embodiments, the dielectric cap 50 is formed of multiple dielectric cap layers. The dielectric cap 50 includes any non-oxygen having a dielectric capping material such as, for example, SiC, $Si_3N_4$, a carbon doped oxide, a nitrogen and hydrogen doped silicon carbide SiC(N,H), boron nitride, SiCBN, carbon boron nitride or multilayers thereof.

Figure 17:
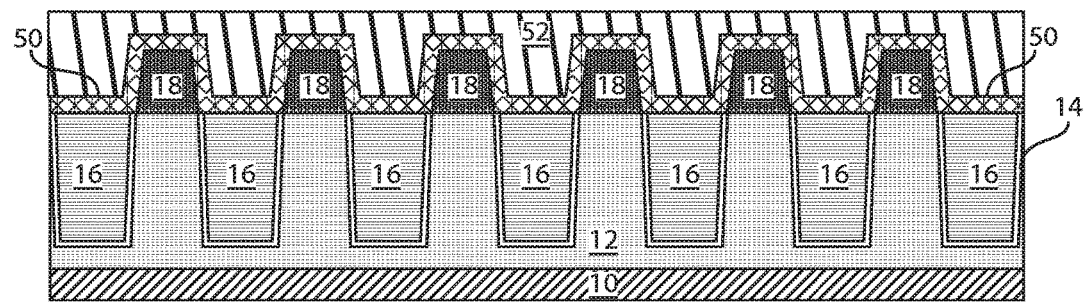
FIG. 17 is a cross-sectional view of the semiconductor structure of FIG. 16 where a dielectric is deposited over the dielectric cap, in accordance with an embodiment of the present invention.

FIG. 17 is a cross-sectional view of the semiconductor structure of FIG. 16 where a dielectric is deposited over the dielectric cap, in accordance with an embodiment of the present invention.

In various exemplary embodiments, a dielectric layer 52 is deposited over the dielectric cap 50.

Figure 18:
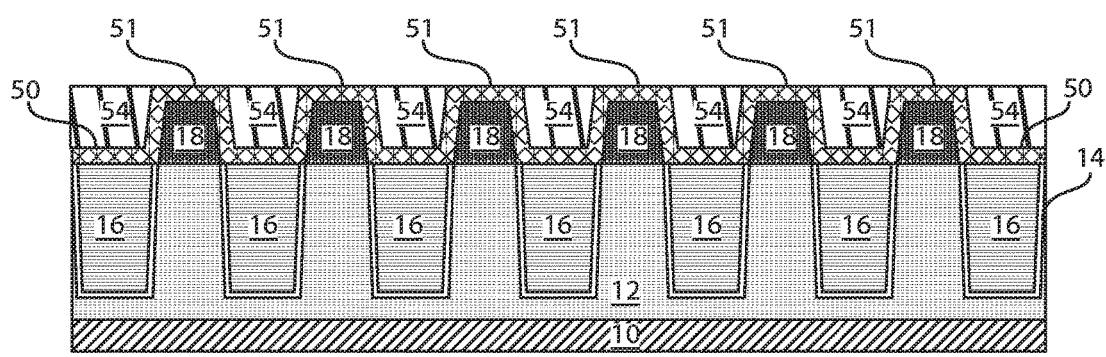
FIG. 18 is a cross-sectional view of the semiconductor structure of FIG. 17 where the dielectric is planarized such that a top surface of the dielectric cap is flush with a top surface of the dielectric, in accordance with an embodiment of the present invention.

FIG. 18 is a cross-sectional view of the semiconductor structure of FIG. 17 where the dielectric is planarized such that a top surface of the dielectric cap is flush with a top surface of the dielectric, in accordance with an embodiment of the present invention.

In various exemplary embodiments, the dielectric layer 52 is planarized. A height of the dielectric layer 52 can be reduced by chemical-mechanical polishing (CMP) and/or etching. Therefore, the planarization process can be provided by CMP. Other planarization process can include grinding and polishing. The planarization of dielectric layer 52 results in dielectric regions 54 formed between the ILD regions 18. A top surface 51 of the dielectric cap 50 is also exposed.

Figure 19:
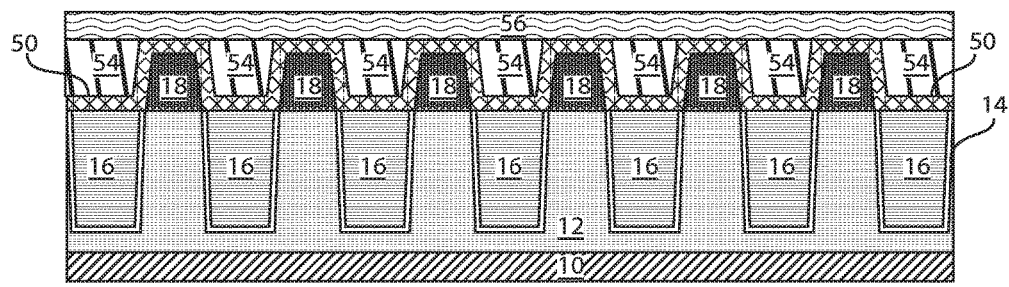
FIG. 19 is a cross-sectional view of the semiconductor structure of FIG. 18 where a hardmask is deposited, in accordance with an embodiment of the present invention.

FIG. 19 is a cross-sectional view of the semiconductor structure of FIG. 18 where a hardmask is deposited, in accordance with an embodiment of the present invention.

In various exemplary embodiments, a hardmask 56 is deposited over the dielectric regions 54, as well as over the exposed portions of the dielectric cap 50.

Figure 20:
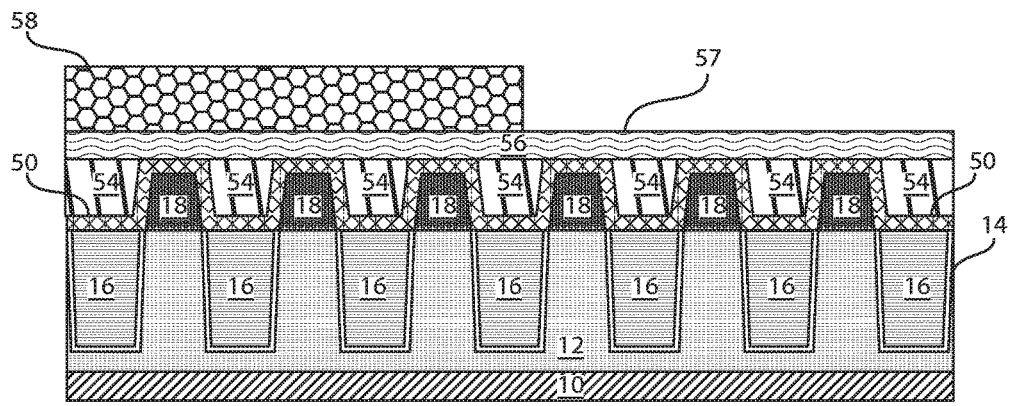
FIG. 20 is a cross-sectional view of the semiconductor structure of FIG. 19 where a sacrificial layer is deposited over a portion of the hardmask, in accordance with an embodiment of the present invention.

FIG. 20 is a cross-sectional view of the semiconductor structure of FIG. 19 where a sacrificial layer is deposited over a portion of the hardmask, in accordance with an embodiment of the present invention.

In various exemplary embodiments, a sacrificial layer 58 is deposited over a portion of the hardmask 56. A top surface 57 of the hardmask 56 is thus exposed. The sacrificial layer 58 can be, for example, amorphous carbon (a-C). The sacrificial layer 58 can be deposited by a suitable deposition process, for example, chemical vapor deposition (CVD), or other suitable process.

Figure 21:
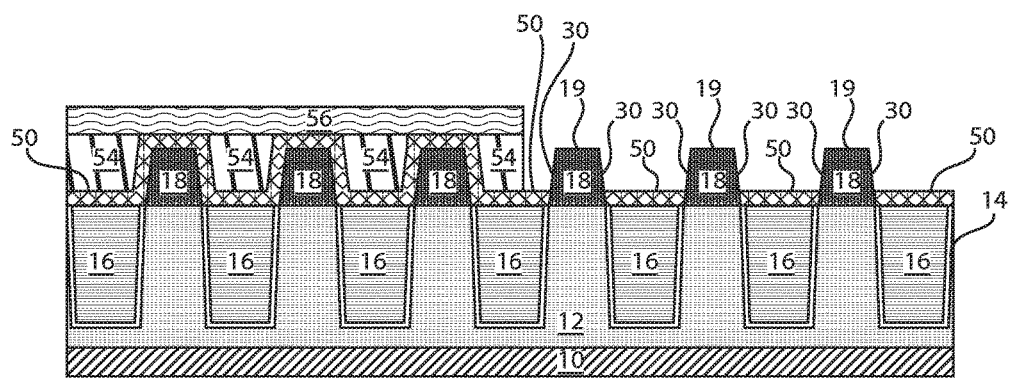
FIG. 21 is a cross-sectional view of the semiconductor structure of FIG. 20 where the exposed hardmask is removed, the exposed dielectric is removed, the exposed dielectric cap is removed, and the sacrificial layer are removed to expose a portion of the ILD regions, in accordance with an embodiment of the present invention.

FIG. 21 is a cross-sectional view of the semiconductor structure of FIG. 20 where the exposed hardmask is removed, the exposed dielectric is removed, the exposed dielectric cap is removed, and the sacrificial layer are removed to expose a portion of the ILD regions, in accordance with an embodiment of the present invention.

In various exemplary embodiments, the exposed hardmask 56 is etched and the sacrificial layer 58 is completely removed. A section or portion of the hardmask 56 remains intact to cover a portion of the dielectric regions 54 and a portion of the ILD regions 18. Moreover, the ILD regions 18 are exposed such that the top surfaces 19 are fully exposed and the sidewalls 30 are partially exposed. Moreover, sections of the dielectric cap 50 are exposed between the ILD regions 18.

Figure 22:
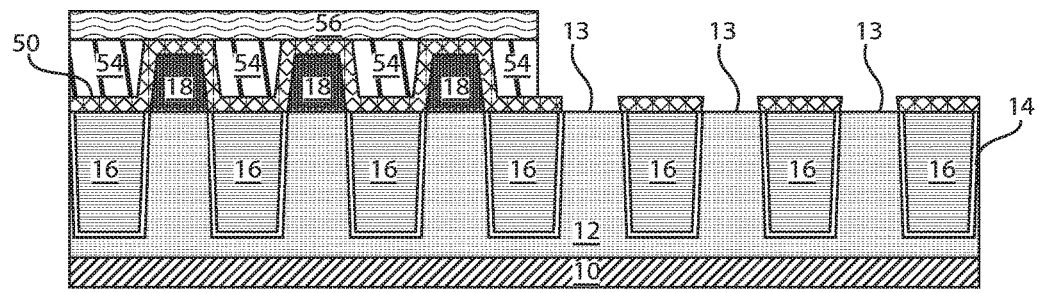
FIG. 22 is a cross-sectional view of the semiconductor structure of FIG. 21 where the exposed ILD regions are selectively removed, in accordance with an embodiment of the present invention.

FIG. 22 is a cross-sectional view of the semiconductor structure of FIG. 21 where the exposed ILD regions are selectively removed, in accordance with an embodiment of the present invention.

In various exemplary embodiments, the exposed ILD regions 18 are selectively removed such that top surfaces 13 of the insulating layer 12 are exposed.

Figure 23:
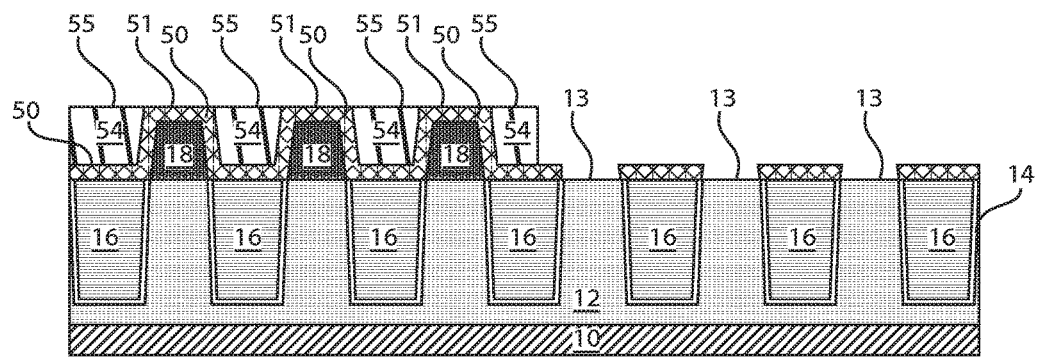
FIG. 23 is a cross-sectional view of the semiconductor structure of FIG. 22 where the remaining hardmask is removed to expose remaining dielectric, in accordance with an embodiment of the present invention.

FIG. 23 is a cross-sectional view of the semiconductor structure of FIG. 22 where the remaining hardmask is removed to expose remaining dielectric, in accordance with an embodiment of the present invention.

In various exemplary embodiments, the hardmask 56 is removed. The remaining hardmask 56 can be removed by employing a dry etching process, for example, and anisotropic etching process.

Figure 24:
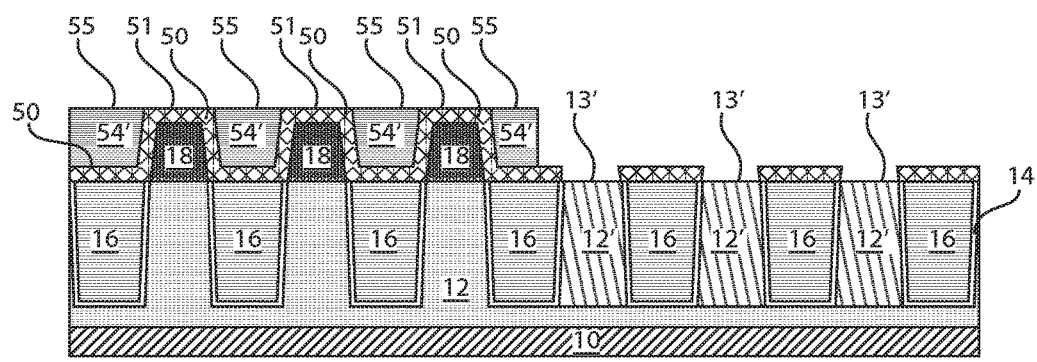
FIG. 24 is a cross-sectional view of the semiconductor structure of FIG. 23 where minimal ILD damage occurs for the exposed dielectric and the exposed portions of the dielectric layer, in accordance with an embodiment of the present invention.

FIG. 24 is a cross-sectional view of the semiconductor structure of FIG. 23 where minimal ILD damage occurs for the exposed dielectric and the exposed portions of the dielectric layer, in accordance with an embodiment of the present invention.

In various exemplary embodiments, minimal ILD damage is caused to form dielectric regions 54' and insulating layer areas 12' with top surfaces 13' between the Cu regions 16. An ash process can be employed to cause the minimal ILD damage. As a consequence of such a chemically and physically "friendly" ash process, the original chemical and physical integrity of the remaining materials is maintained.

Figure 25:
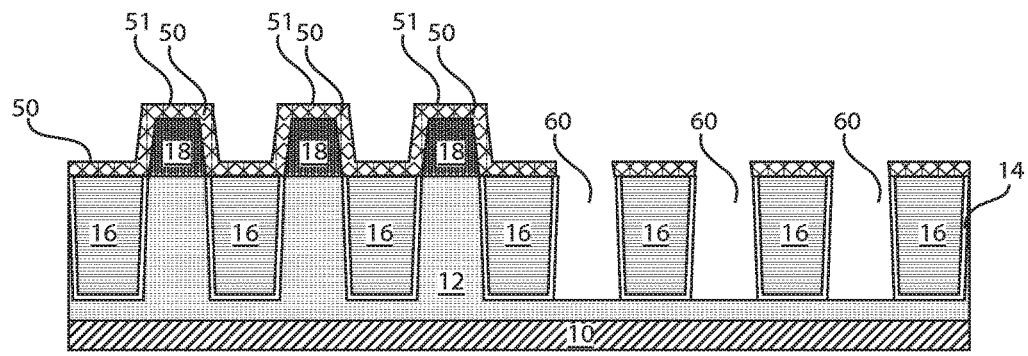
FIG. 25 is a cross-sectional view of the semiconductor structure of FIG. 24 where the minimal ILD damaged exposed dielectric and exposed portions of the dielectric layer are selectively removed to form recesses between the Cu regions, in accordance with an embodiment of the present invention.

FIG. 25 is a cross-sectional view of the semiconductor structure of FIG. 24 where the minimal ILD damaged exposed dielectric and exposed portions of the dielectric layer are selectively removed to form recesses between the Cu regions, in accordance with an embodiment of the present invention.

In various exemplary embodiments, the dielectric regions 54' and the insulating layer areas 12' are selectively removed by, e.g., DHF resulting in recesses 60 formed between the Cu regions 16. The recesses 60 are formed in the airgap region of the device.

Figure 26:
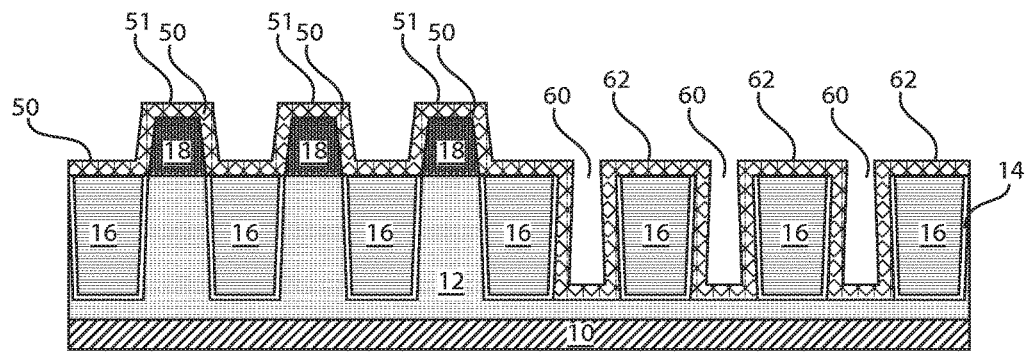
FIG. 26 is a cross-sectional view of the semiconductor structure of FIG. 25 where a conformal cap is deposited within the recesses, in accordance with an embodiment of the present invention.

FIG. 26 is a cross-sectional view of the semiconductor structure of FIG. 25 where a conformal cap is deposited within the recesses, in accordance with an embodiment of the present invention.

In various exemplary embodiments, a conformal cap 62 can be formed within the recesses 60.

Figure 27:
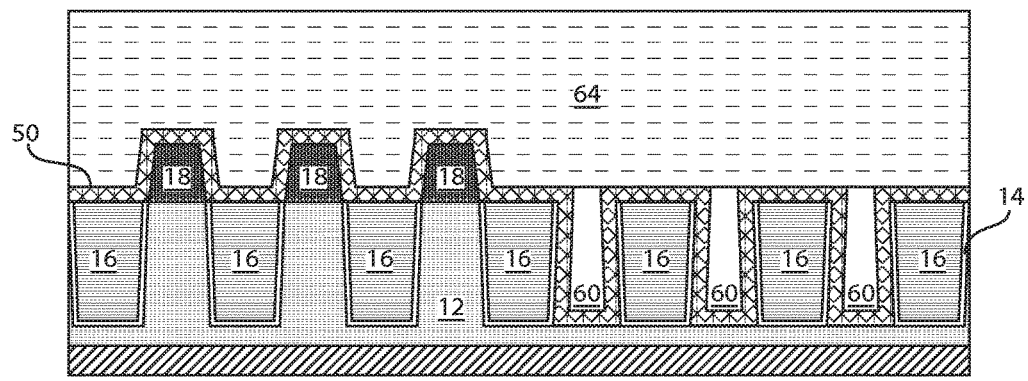
FIG. 27 is a cross-sectional view of the semiconductor structure of FIG. 26 where an ILD layer is deposited over the structure such that airgaps are formed at the exposed portions of the insulating layer, in accordance with an embodiment of the present invention.

FIG. 27 is a cross-sectional view of the semiconductor structure of FIG. 26 where an ILD layer is deposited over the structure such that airgaps are formed at the exposed portions of the insulating layer, in accordance with an embodiment of the present invention.

In various exemplary embodiments, a dielectric layer 64 (e.g., an oxide layer) is then deposited over structure. The dielectric layer 64 can be an interlevel dielectric (ILD).

The deposition of the dielectric layer 64 causes airgaps 60 to be maintained within the airgap region. Thus, an airgap and selective-dielectric fully-aligned via (FAV) can be integrated at the same metallization level without using an additional airgap mask. The ILD regions 18 serve as the selective dielectric for the FAV. The selective ILD regions 18 are thus employed as a mask for formation of the airgaps 60. Thus, a FAV with selective dielectric guiding pattern can be created at the same metallization level with airgaps 60 formed on a different part of the chip. The airgaps 60 enable low capacitance wiring in semiconductor devices. The block mask 56 can be used so that only areas on the chip with minimum spaces and a need for low capacitance receive the airgaps 60. This maximizes the thermal conductance and mechanical stability of the chip.

Figure 28:
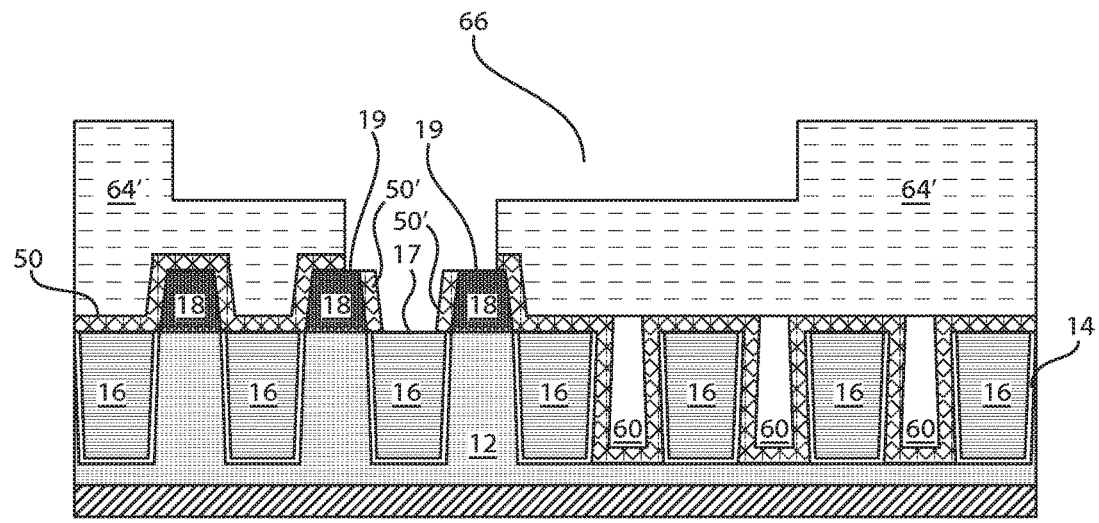
FIG. 28 is a cross-sectional view of the semiconductor structure of FIG. 27 where the ILD layer is etched to expose a top surface of at least one Cu region and top surfaces of ILD regions, in accordance with an embodiment of the present invention.

FIG. 28 is a cross-sectional view of the semiconductor structure of FIG. 27 where the ILD layer is etched to expose a top surface of at least one Cu region and top surfaces of ILD regions, in accordance with an embodiment of the present invention.

In various exemplary embodiments, the dielectric layer 64 is etched to form remaining dielectric layers 64'. A recess 66 is formed exposing a top surface 19 of the dielectric regions 18 and a top surface 17 of a Cu region 16. Additionally, conformal cap portions 50' remain adjacent sidewalls of the ILD regions 18. The recess 66 can be, e.g., a via. The via 66 can be referred to as a fully-aligned via (FAV). The FAV can be aligned with the ILD regions 18 in the non-airgap region or FAV region.

Figure 29:
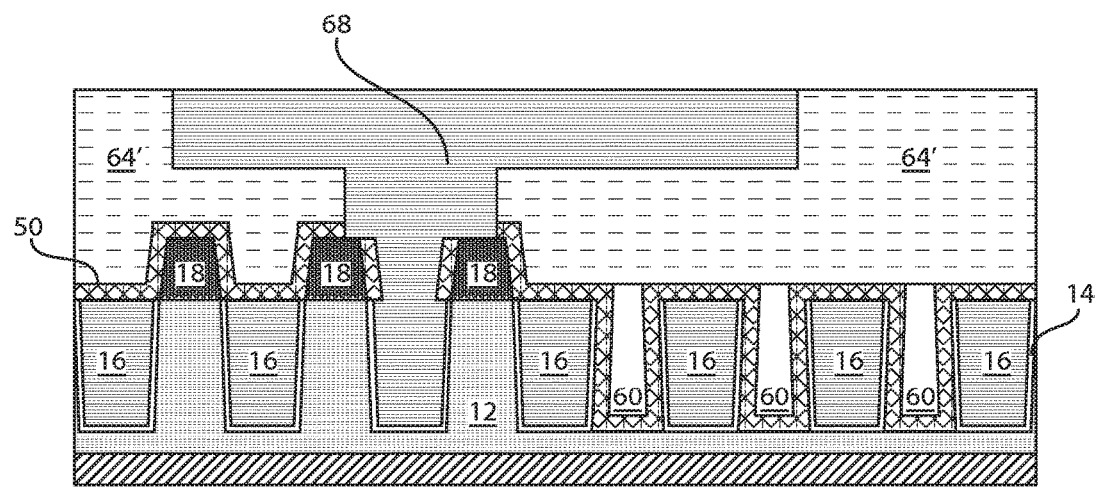
FIG. 29 is a cross-sectional view of the semiconductor structure of FIG. 28 where a metal fill takes place, in accordance with an embodiment of the present invention.

FIG. 29 is a cross-sectional view of the semiconductor structure of FIG. 28 where a metal fill takes place, in accordance with an embodiment of the present invention.

In various exemplary embodiments, a metal fill 68 takes place. The metal fill 68 can be, e.g., Cu or any other conductive material contemplated by one skilled in the art.

Figure 30:
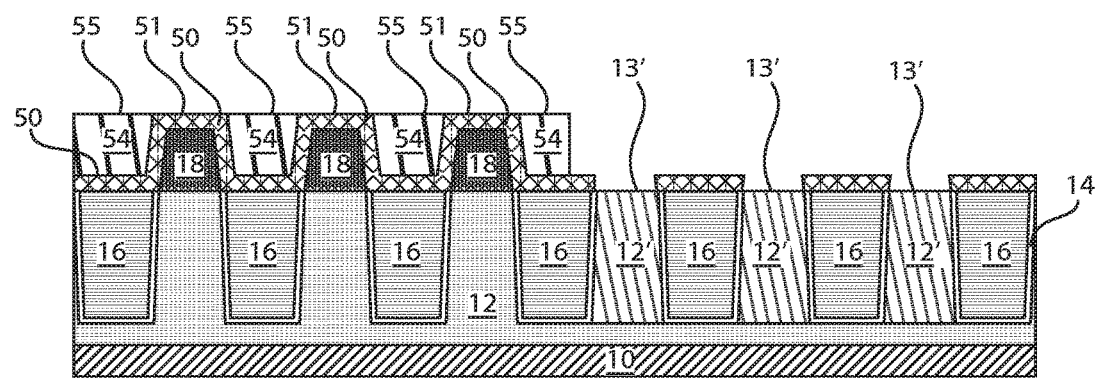
FIG. 30 is a cross-sectional view of the semiconductor structure of FIG. 24 where ILD damage occurs only to the exposed portions of the insulating layer, in accordance with another embodiment of the present invention.

FIG. 30 is a cross-sectional view of the semiconductor structure of FIG. 24 where ILD damage occurs only to the exposed portions of the insulating layer, in accordance with another embodiment of the present invention.

In various exemplary embodiments, minimal ILD damage is caused to form only insulating layer areas 12' with top surfaces 13' between the Cu regions 16. An ash process can be employed to cause the minimal ILD damage. As a consequence of such a chemically and physically "friendly" ash process, the original chemical and physical integrity of the remaining materials is maintained.

Figure 31:
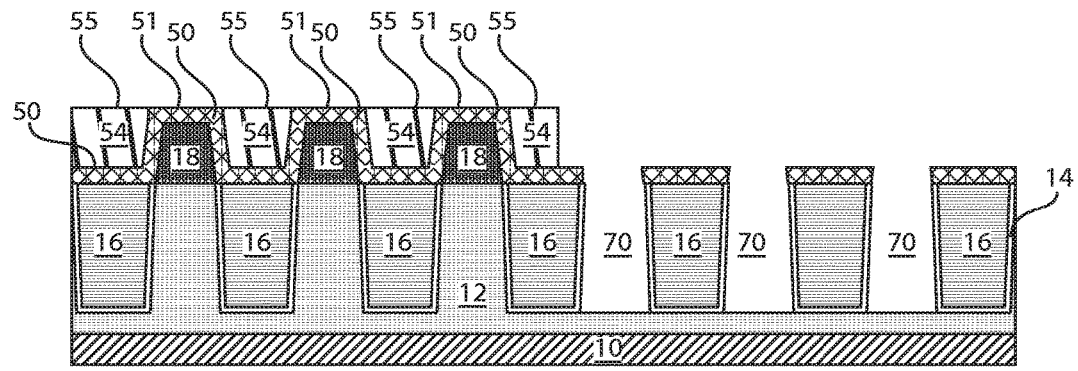
FIG. 31 is a cross-sectional view of the semiconductor structure of FIG. 30 where the ILD damaged exposed portions of the insulating layer are selectively removed to form recesses or gaps, in accordance with an embodiment of the present invention.

FIG. 31 is a cross-sectional view of the semiconductor structure of FIG. 30 where the ILD damaged exposed portions of the insulating layer are selectively removed to form recesses or gaps, in accordance with an embodiment of the present invention.

In various exemplary embodiments, the insulating layer areas 12' are selectively removed to form recesses 70 between the Cu regions 16.

Figure 32:
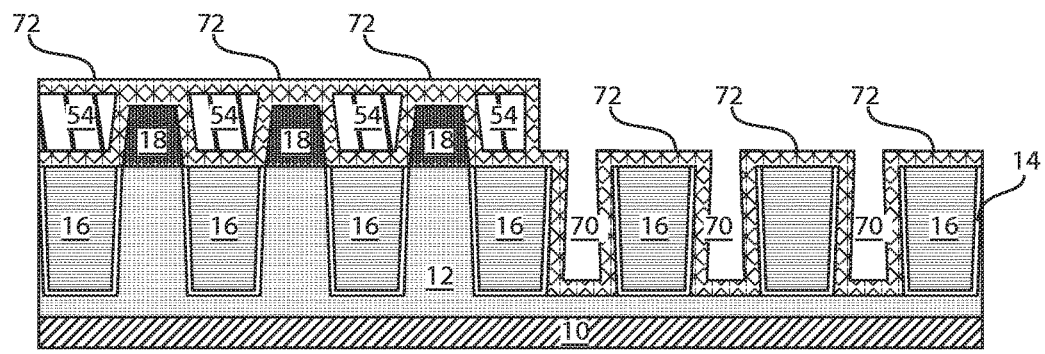
FIG. 32 is a cross-sectional view of the semiconductor structure of FIG. 31 where a conformal cap is deposited within the recesses or gaps, in accordance with an embodiment of the present invention.

FIG. 32 is a cross-sectional view of the semiconductor structure of FIG. 31 where a conformal cap is deposited within the recesses or gaps, in accordance with an embodiment of the present invention.

In various exemplary embodiments, a conformal cap 72 can be formed over the dielectric regions 54 and within the recesses 70. The conformal cap 72 can extend across the entire structure.

Figure 33:
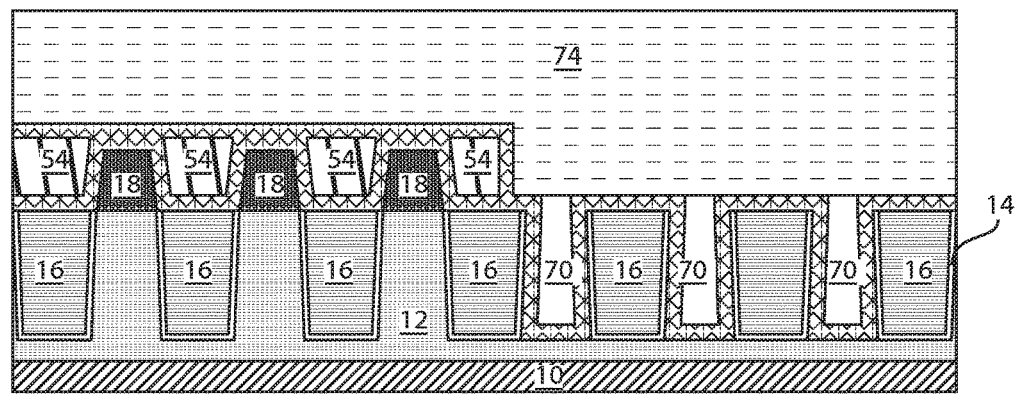
FIG. 33 is a cross-sectional view of the semiconductor structure of FIG. 32 where a dielectric layer is deposited over the structure such that airgaps are formed at the exposed portions of the insulating layer, in accordance with an embodiment of the present invention.

FIG. 33 is a cross-sectional view of the semiconductor structure of FIG. 32 where a dielectric layer is deposited over the structure such that airgaps are formed at the exposed portions of the insulating layer, in accordance with an embodiment of the present invention.

In various exemplary embodiments, a dielectric layer 74 (e.g., an oxide layer) is then deposited over structure. The dielectric layer 74 can be an interlevel dielectric (ILD).

The deposition of the dielectric layer 74 causes airgaps 70 to be maintained within the airgap region. Thus, an airgap and selective-dielectric fully-aligned via (FAV) can be integrated at the same metallization level without using an additional airgap mask. The ILD regions 18 serve as the selective dielectric for the FAV. The selective ILD regions 18 are thus employed as a mask for formation of the airgaps 70. Thus, a FAV with selective dielectric guiding pattern can be created at the same metallization level with airgaps 70 formed on a different part of the chip.

Figure 34:
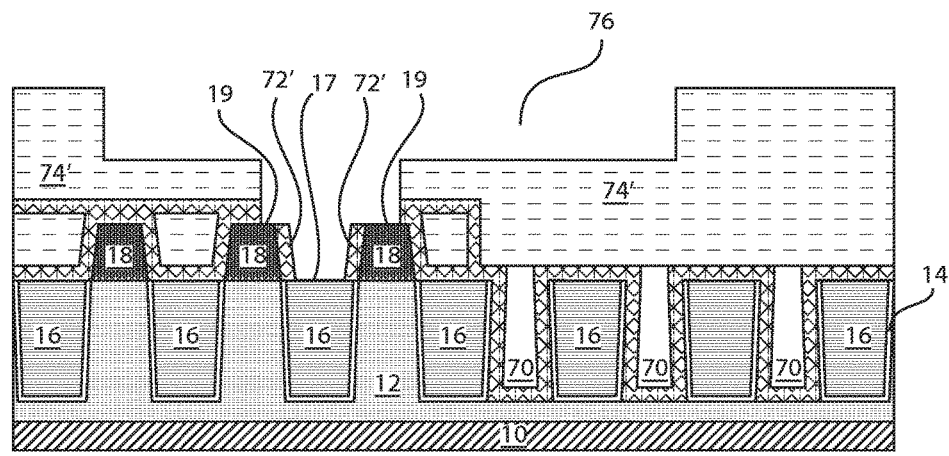
FIG. 34 is a cross-sectional view of the semiconductor structure of FIG. 33 where the ILD layer is etched to expose a top surface of at least one Cu region and top surfaces of ILD regions, in accordance with an embodiment of the present invention.

FIG. 34 is a cross-sectional view of the semiconductor structure of FIG. 33 where the ILD layer is etched to expose a top surface of at least one Cu region and top surfaces of ILD regions, in accordance with an embodiment of the present invention.

In various exemplary embodiments, the dielectric layer 74 is etched to form remaining dielectric layers 74'. A recess 76 is formed exposing a top surface 19 of the dielectric regions 18 and a top surface 17 of a Cu region 16. Additionally, conformal cap portions 72' remain adjacent sidewalls of the ILD regions 18. The recess 76 can be, e.g., a via. The via 76 can be referred to as a fully-aligned via (FAV). The FAV can be aligned with the ILD regions 18 in the non-airgap region or FAV region.

Figure 35:
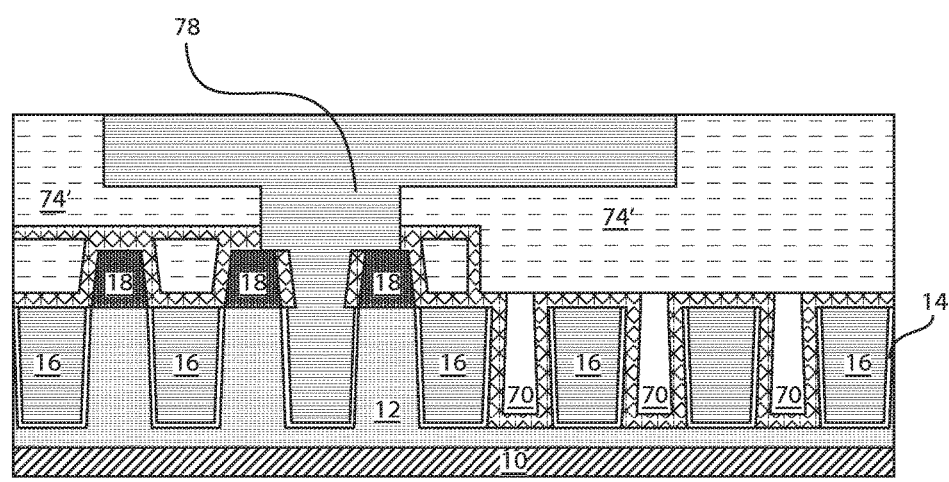
FIG. 35 is a cross-sectional view of the semiconductor structure of FIG. 34 where a metal fill takes place, in accordance with an embodiment of the present invention.

FIG. 35 is a cross-sectional view of the semiconductor structure of FIG. 34 where a metal fill takes place, in accordance with an embodiment of the present invention.

In various exemplary embodiments, a metal fill 78 takes place. The metal fill 78 can be, e.g., Cu or any other conductive material contemplated by one skilled in the art.

Therefore, in summary, selective dielectric deposition is used to achieve both a fully aligned via (aligned to the metal above and below) and airgaps concurrently or simultaneously. Removing portions of selective ILD regions in airgap regions enables multiple airgap formation within the airgap region of the device. The vias are formed in a second interconnect level and are confined by the selective ILD regions to align with a first interconnect level (where the ILD regions were formed).

The interconnect structures disclosed herein can be incorporated into any electrical device. For example, the interconnect structures can be present within electrical devices that use semiconductors that are present within integrated circuit chips. The integrated circuit chips including the disclosed interconnects can be integrated with other chips, discrete circuit elements, and/or other signal processing devices as part of either (a) an intermediate product, such as a motherboard, or (b) an end product. The end product can be any product that includes integrated circuit chips, including computer products or devices having a display, a keyboard or other input device, and a central processing unit.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for an integrated airgap and selective-dielectric fully-aligned via (FAV) at a same metallization level without an additional airgap mask (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a fully-aligned via (FAV) and airgaps within a semiconductor device, the method comprising:
   forming a plurality of trenches within an insulating layer formed over a semiconductor substrate, the plurality of trenches filled with a conductive material;
   selectively forming inter-layer dielectric (ILD) regions over exposed top surfaces of the insulating layer;
   forming a hardmask;
   selectively removing a portion of the ILD regions where the airgaps are subsequently formed;
   removing the hardmask;
   causing minimal ILD damage at least to exposed sections of the insulating layer located on sidewalls of the plurality of trenches;
   removing the ILD damaged sections of the insulating layer to form recesses defining an airgap region;
   depositing a conformal cap within the recesses; and
   depositing a dielectric layer such that the airgaps are formed between the plurality of trenches in the airgap region.

2. The method of claim 1, further comprising forming the airgaps of the airgap region and the FAV at a same metallization level.

3. The method of claim 1, further comprising recessing the dielectric layer in a non-airgap region to expose a top surface of a conductive material of a trench of the plurality of trenches.

4. The method of claim 3, further comprising exposing a top surface of one or more ILD regions formed in the non-airgap region.

5. The method of claim 4, further comprising filling the recessed dielectric layer with a metal contacting the exposed top surface of the conductive material of the trench.

6. The method of claim 4, wherein the one or more ILD regions in the non-airgap region act as a mask for formation of the airgaps in the airgap region.

7. The method of claim 1, further comprising aligning the FAV within areas including the ILD regions.

8. The method of claim 1, further comprising depositing a dielectric cap over the ILD regions before subsequent selective removal of ILD regions where the airgaps are to be formed.

9. A method for forming a fully-aligned via (FAV) and airgaps within a semiconductor device, the method comprising:
   forming a plurality of copper (Cu) trenches within an insulating layer;
   forming a plurality of ILD regions over exposed portions of the insulating layer;
   selectively removing a first section of the ILD regions in an airgap region;
   maintaining a second section of the ILD regions in a non-airgap region;
   forming airgaps in the airgap region;
   forming a via in the non-airgap region contacting a Cu trench of the plurality of Cu trenches, the via filled with Cu; and
   causing minimal ILD damage at least to the exposed portions of the insulating layer located on sidewalls of the plurality of Cu trenches.

10. The method of claim 9, further comprising depositing a conformal cap within the airgap region.

11. The method of claim 10, further comprising forming the airgaps between the plurality of Cu trenches by depositing a dielectric layer over the airgap region.

12. The method of claim 9, further comprising forming the airgaps of the airgap region and the FAV at a same metallization level.

13. The method of claim 9, further comprising depositing a dielectric cap over the plurality of ILD regions before subsequent selective removal of ILD regions where the airgaps are to be formed.

* * * * *